US010270369B2

(12) United States Patent
Sugawara et al.

(10) Patent No.: US 10,270,369 B2
(45) Date of Patent: Apr. 23, 2019

(54) ELECTRIC GENERATING ELEMENT AND ELECTRIC GENERATOR

(71) Applicants: Tomoaki Sugawara, Kanagawa (JP); Junichiro Natori, Kanagawa (JP); Tsuneaki Kondoh, Kanagawa (JP); Yuko Arizumi, Kanagawa (JP); Mizuki Otagiri, Kanagawa (JP); Takahiro Imai, Tokyo (JP)

(72) Inventors: Tomoaki Sugawara, Kanagawa (JP); Junichiro Natori, Kanagawa (JP); Tsuneaki Kondoh, Kanagawa (JP); Yuko Arizumi, Kanagawa (JP); Mizuki Otagiri, Kanagawa (JP); Takahiro Imai, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 428 days.

(21) Appl. No.: 15/052,329

(22) Filed: Feb. 24, 2016

(65) Prior Publication Data

US 2016/0276957 A1   Sep. 22, 2016

(30) Foreign Application Priority Data

Mar. 18, 2015 (JP) ................................. 2015-054780

(51) Int. Cl.
*H02N 1/04* (2006.01)
*H01L 41/113* (2006.01)
(Continued)

(52) U.S. Cl.
CPC ............. *H02N 1/04* (2013.01); *H01L 41/113* (2013.01); *H02N 2/186* (2013.01)

(58) Field of Classification Search
CPC .. H02N 1/00; H02N 1/04; H02N 1/08; H02N 2/186; H01L 41/113; H01L 41/1132; H01L 41/1138
See application file for complete search history.

(56) References Cited

U.S. PATENT DOCUMENTS

2011/0148256 A1\*  6/2011  Fujimoto .............. H01L 41/113
                                                                 310/339
2012/0169179 A1   7/2012  Masaki et al.
(Continued)

FOREIGN PATENT DOCUMENTS

CN    103368447 A    10/2013
EP    3 021 476      5/2016
(Continued)

OTHER PUBLICATIONS

Combined Office Action and Search Report dated Feb. 23, 2018 in the corresponding Chinese Application No. 201610157618.8 (with English Translation) citing document AO therein 14 pages.
(Continued)

*Primary Examiner* — Edgardo San Martin
(74) *Attorney, Agent, or Firm* — Oblon, McClelland, Maier & Neustadt, L.L.P.

(57) ABSTRACT

To provide an electric generating element including a first electrode; an intermediate layer; and a second electrode, the first electrode, the intermediate layer, and the second electrode being disposed in this order, the intermediate layer being in contact with at least one of the first electrode and the second electrode, wherein the intermediate layer microscopically moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode.

12 Claims, 6 Drawing Sheets

(51) Int. Cl.
*H02N 2/18* (2006.01)
*H02N 1/00* (2006.01)
*H01L 41/08* (2006.01)

(56) References Cited

U.S. PATENT DOCUMENTS

| | | | | |
|---|---|---|---|---|
| 2012/0247217 | A1* | 10/2012 | Suzuki | B25J 13/082 |
| | | | | 73/717 |
| 2013/0307371 | A1* | 11/2013 | Sakashita | H01L 41/113 |
| | | | | 310/300 |
| 2014/0111063 | A1* | 4/2014 | Bae | H01L 41/0477 |
| | | | | 310/339 |
| 2014/0246950 | A1 | 9/2014 | Wang et al. | |
| 2015/0030363 | A1 | 1/2015 | Sugawara et al. | |
| 2015/0078794 | A1 | 3/2015 | Natori et al. | |
| 2015/0248083 | A1 | 9/2015 | Kondoh et al. | |
| 2016/0238466 | A1* | 8/2016 | Tanimoto | G01L 1/16 |
| 2016/0268932 | A1* | 9/2016 | Takao | B60R 19/52 |
| 2016/0336505 | A1* | 11/2016 | Arizumi | H01L 41/113 |
| 2017/0148973 | A1* | 5/2017 | Imai | H01L 41/113 |
| 2017/0149357 | A1* | 5/2017 | Otagiri | H02N 1/00 |
| 2017/0170749 | A1* | 6/2017 | Arizumi | H02N 1/04 |
| 2017/0324023 | A1* | 11/2017 | Kondoh | H01L 41/113 |
| 2018/0013057 | A1* | 1/2018 | Arizumi | H01L 41/193 |

FOREIGN PATENT DOCUMENTS

| | | |
|---|---|---|
| JP | 11-252945 | 9/1999 |
| JP | 2006-158112 | 6/2006 |
| JP | 2008-037938 | 2/2008 |
| JP | 2010-104105 | 5/2010 |
| JP | 2011-147228 | 7/2011 |
| JP | 2012-10564 A | 1/2012 |
| JP | 5126038 | 11/2012 |
| JP | 2014-027756 | 2/2014 |
| JP | 5480414 | 2/2014 |
| JP | 2014-529913 | 11/2014 |
| WO | 2015/003497 A1 | 1/2015 |

OTHER PUBLICATIONS

Omron Corporation, Development of small "Energy harvesting oscillation device" that generates power with minute vibrations, [online], cited on Nov. 11, 2008, Internet URL:http://www.omron.co.jp/press/2008/11/c1111.html (with Partial English Translation).

Extended European Search Report dated Oct. 6, 2016 in European Patent Application No. 16159432.0.

Combined Chinese Office Action and Search Report dated Jul. 23, 2018, in Patent Application No. 201610157618.8 (with English translation), citing document AX therein, 18 pages.

Feng Shifen, et al., "Oxidative Degradation of Plasma-Treated Silicone Rubber Surfaces" Chinese Journal of Materials Research, vol. 13, No. 4, Aug. 31, 1999, pp. 445-448 (with English Abstract).

European Search Report dated Dec. 12, 2018, in European Patent Application No. 16 159 432.0, filed Mar. 9, 2016, 39 pages.

* cited by examiner

ELECTRIC GENERATING ELEMENT AND ELECTRIC GENERATOR

CROSS-REFERENCE TO RELATED APPLICATIONS

The present application claims priority under 35 U.S.C. § 119 to Japanese Patent Application No. 2015-054780, filed Mar. 18, 2015. The contents of which are incorporated herein by reference in their entirety.

BACKGROUND OF THE INVENTION

Field of the Invention

The present disclosure relates to electric generating elements, and electric generators.

Description of the Related Art

There have been conventionally attempts for effectively utilizing the energy generated by vibrations of a structure, such as roads, bridges, and architecture, vibrations of a moving body, such as cars, and train carriages, and vibration due to human activities. As for a method for effectively utilizing the energy generated by vibrations, there is a method where vibration energy is converted into electric energy. Examples of such a method include a system utilizing a piezoelectric element, and a system utilizing electrostatic induction.

The system utilizing the piezoelectric element uses mainly a ceramic-based piezoelectric element, and utilizes a phenomenon that electric charge is induced at a surface of the piezoelectric element when distortion is applied to the piezoelectric element due to vibrations (see, for example, Japanese Unexamined Patent Application Publication No. 2010-104105).

The system utilizing the electrostatic induction typically uses an electret dielectric retaining electric charge semipermanently (see, for example, Japanese Patent No. 5480414, Japanese Unexamined Patent Application Publication No. 2014-027756, and Japanese Patent No. 5126038). The electret dielectric used in the aforementioned literatures is a material capable of charging the dielectric to generate an electrostatic field semipermanently. Electric charge is induced to an electrode through electrostatic induction by changing a relative position between the electret dielectric and the electrode disposed being distant from the electret dielectric due to vibrations. As a result, electricity is generated.

Moreover, it has been known that extremely high potential can be attained by using an amorphous fluororesin as an electret material, and forming the fluororesin into strip-shaped electret electrodes (see, for example, OMRON Corporation, Development of small "Energy harvesting oscillation device" that generates power with minute vibrations, [online], sited on Nov. 11, 2008, Internet <URL:http://www.omron.co.jp/press/2008/11/c1111.html>).

Furthermore, proposed is an electric generator, which contains a first electrode, a second electrode, a first dielectric layer, and a second dielectric layer, and generates electricity utilizing friction charge (see, for example, US Patent Application Publication No. US 2014/0246950).

SUMMARY OF THE INVENTION

Since the system utilizing the piezoelectric element disclosed in Japanese Unexamined Patent Application Publication No. 2010-104105 uses mainly a ceramic-based piezoelectric element, there are problems that the element does not have flexibility and the element is easily broken.

In the system utilizing electrostatic induction, as disclosed in Japanese Patent No. 5480414, Japanese Unexamined Patent Application Publication No. 2014-027756, and Japanese Patent No. 5126038, moreover, a charging treatment needs to be performed on a dielectrics, when an electret derivative for use is produced. Examples of the charging treatment include corona discharge, and a plasma treatment. However, these treatments have a problem that a large quantity of electricity is required. Moreover, a flexibility of an element is not sufficient. In addition, a mechanical capacity varying system is typically disposed, it is difficult to realize a flexible element. In the case where the amorphous fluororesin disclosed in OMRON Corporation, Development of small "Energy harvesting oscillation device" that generates power with minute vibrations, [online], sited on Nov. 11, 2008, Internet <URL:http://www.omron.co.jp/press/2008/11/c1111.html> is used, moreover, there is a problem that the electric generating element tends to break, as discharge is caused when high voltage is applied.

The electric generator of the system utilizing friction charge, disclosed in US Patent Application Publication No. US 2014/0246950, is largely deformed, when a load is externally applied. Therefore, there is a problem that the electricity generation efficiency is degraded.

Accordingly, the present invention aims to provide an electric generating element, which has a high electricity generation performance and does not break when an external load is applied.

As the means for solving the aforementioned problems, the electric generating element of the present invention includes a first electrode, an intermediate layer, and a second electrode, the first electrode, the intermediate layer, and the second electrode being disposed in this order. The intermediate layer is in contact with at least one of the first electrode and the second electrode. The intermediate layer microscopically moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode. Moreover, a convex structure is formed at a surface of at least one of the first electrode and the second electrode, the surface being in contact with the intermediate layer. As pressure is applied through the convex structure and the flexible intermediate layer in a vertical direction relative to the surfaces of the first electrode and the second electrode, a contact area between the electrode surface and the intermediate layer increases to facilitate a horizontal movement of the intermediate layer in the microscopic scale, along the electrode surface.

The present invention can provide an electric generating element, which has a high electricity generation performance and does not break when an external load is applied.

Figure 1:
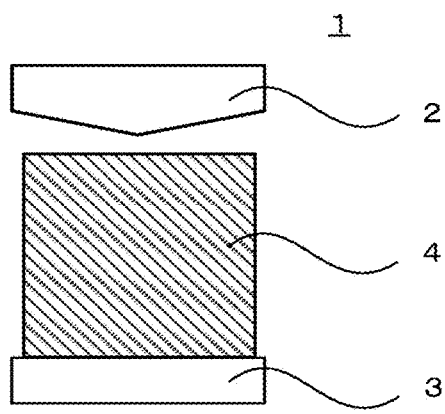
FIG. 1 is a schematic cross-sectional view illustrating one example of the electric generating element of the present invention.

DETAILED DESCRIPTION OF THE INVENTION (Electric Generating Element)

The electric generating element of the present invention includes a first electrode, an intermediate layer, and a second electrode, the first electrode, the intermediate layer, and the second electrode being disposed in this order. The electric generating element may further include other members, if necessary.

The electric generating element of the present invention does not have any charge or internal charge initially. As a vertical load is externally applied to the intermediate layer, a stress is generated in a lateral direction, and electric charge is generated by friction charging, to thereby generate electricity. However, frictions at an interface between the intermediate layer and the electrode is typically large, and sliding is not caused unless a large force is applied. As an electrode having irregularity, particularly a convex-shaped electrode, or a pressing member is pressed against a soft intermediate layer, a surface area of rubber of the intermediate layer is reversibly increased or decreased owing to stretchability of the rubber. As a result, the intermediate layer microscopically moves in a horizontal direction relative to surfaces of the first electrode and the second electrode, to thereby attain the higher electricity generation efficiency. Note that, the phrase "moves in a horizontal direction" means minutely moves in a horizontal direction in a degree that can be recognized with the naked eye.

<First Electrode and Second Electrode>

A material, shape, size, and structure of each of the first electrode and the second electrode are appropriately selected depending on the intended purpose without any limitation.

The material, shape, size, and structure of the first electrode may be the same or different from the material, shape, size, and structure of the second electrode, but the material, shape, size, and structure of the first electrode are preferably the same as the material, shape, size, and structure of the second electrode. Moreover, a movement facilitation member is preferably disposed.

Examples of the material of the first electrode and the second electrode include metal, a carbon-based conductive material, and a conductive rubber composition.

Examples of the metal include gold, silver, copper, iron, aluminium, stainless steel, tantalum, nickel, and phosphor bronze.

Examples of the carbon-based conductive material include graphite, carbon fiber, and carbon nanotubes.

Examples of the conductive rubber composition include a composition containing conductive filler and rubber.

Examples of the conductive filler include a carbon material (e.g., Ketjenblack, acetylene black, graphite, carbon fiber, carbon fiber (CF), carbon nanofiber (CNF), and carbon nanotube (CNTs)), metal filler (e.g., gold, silver, platinum, copper, iron, aluminium, and nickel), a conductive polymer material (e.g., a derivative of any of polythiophene, polyacetylene, polyaniline, polypyrrole, poly(p-phenylene), and poly(p-phenylene)vinylene derivative, or the derivatives doped with a dopant, such as anions, and cations), and an ionic liquid. These fillers may be used alone or in combination.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex). The aforementioned examples of the rubber may be used alone or in combination.

Examples of the form of the first electrode and the form of the second electrode include a sheet, a film, a thin film, a woven fabric, a non-woven fabric, a mesh, and a sponge. Note that, the form of the first electrode and the form of the second electrode may be each a non-woven fabric formed by overlapping the carbon material in the form of fibers.

Examples of the film include a polymer film.

Examples of the polymer film include a film, in which a metal foil is bonded to a film. As for the polymer film, a commercial product can be used. Examples of the commercial product include AL-PET 9-100, and AL-PET 25-25 (both manufactured by PANAC Corporation).

The shape of the first electrode and the shape of the second electrode are not particularly limited, and are appropriately selected depending on a shape of the electric generating element.

The size of the first electrode and the size of the second electrode are not particularly limited, and are appropriately selected depending on a size of the electric generating element.

The average thickness of the first electrode and the average thickness of the second electrode can be appropriately selected depending on a structure of the electric generating element. In view of conductivity and flexibility of the electric generating element, the average thickness of the first electrode and the average thickness of the second electrode are each preferably in a range of from 0.01 µm through 1 mm, more preferably in a range of from 0.1 µm through 500 µm. When the average thickness of the first electrode and the average thickness of the second electrode are 0.01 µm or greater, an appropriate mechanical strength can be attained, and thus conductivity of a resulting electric generating element improves. When the average thickness of the first electrode and the average thickness of the second electrode are 1 mm or less, a resulting electric generating element is deformable, and thus excellent electricity generation performance can be attained.

«Movement Facilitation Member»

It is preferred that a movement facilitation member configured to facilitate a movement of the intermediate layer be provided at a surface of at least one of the first electrode and the second electrode, the surface being in contact with the intermediate layer, or at a surface of the first electrode opposite to the surface thereof facing the intermediate layer. As the movement facilitation member is disposed, the intermediate layer is easily moved in a horizontal direction relative to the surfaces of the first electrode and the second electrode, hence electric charge is efficiently generated by friction charging, to thereby generate electricity. In the present specification, the term "movement facilitation" means that a changed amount of a position of the intermediate layer, which is not easily deformed by a friction force against the surfaces of the first electrode and the second electrode, is easily increased when pressure is applied vertically relative to the surfaces of the first electrode and the second electrode. The movement facilitation includes an effect of increasing an area relative to a normal flat surface, and an increase in an effect of a parallel movement owing to an effect of separating a vertical pressing component by a convex structure along a horizontal direction.

The movement facilitation member is appropriately selected depending on the intended purpose without any limitation, provided that the movement facilitation member is capable of facilitating the movement of the intermediate layer. Examples thereof include a member where a convex structure is disposed at least one of surfaces of the first electrode and the second electrode facing the intermediate layer, and a member where a pressing member is disposed at a surface of the first electrode opposite to the surface thereof facing the intermediate layer.

—Member Where Convex Structure is Disposed at Least One of Surfaces of the First Electrode and the Second Electrode—

A convex structure may be provided at least one of surfaces of the first electrode and the second electrode facing the intermediate layer.

Examples of a shape of the convex structure include a shape where an apex of the convex structure has an angle, and a shape having a curvature. Specifically, examples of a cross-sectional shape of the convex structure include a semi-circle, a semi-oval, a triangle, and a trapezoid. Among them, a semi-circle is preferable, as a movement can be facilitated more.

—Member Where Pressing Member is Disposed—

The member where a pressing member is disposed, the member can be arranged at a surface of the first electrode opposite to a surface thereof facing the intermediate layer. The intermediate layer can be pressed with the pressing member via the first electrode, to thereby induce a movement of the intermediate layer.

A material, shape, size, and structure of the pressing member are appropriately selected depending on the intended purpose without any limitation, provided that the pressing member can press the intermediate layer via the first electrode.

As for a shape of the pressing member, it is preferred that a convex structure be disposed at a surface of the member facing the first electrode, as the member can efficiently press the intermediate layer via the first electrode. Examples of a shape of the convex structure include a shape where an apex of the convex structure has an angle, and a shape having a curvature. Specifically, examples of a cross-sectional shape of the convex structure include a semi-circle, a semi-oval, a triangle, a rectangular, and a trapezoid.

In the case where the pressing member is disposed, in the present invention, the electric generating element is determined as the electric generating element including the pressing member.

The coefficient of kinetic friction between the material of the intermediate layer and the surface of the first electrode or the second electrode is preferably 1.5 or less, more preferably 0.8 or less. When the coefficient of kinetic friction is 1.5 or less, excellent electricity generation performance is attained.

FIG. 1 is a schematic cross-sectional view illustrating one example of the electric generating element of the present invention. The electric generating element 1 illustrated in FIG. 1 is an example of a nickel electrode where a corn convex structure is formed on the first electrode 2 by electrocasting. As the convex structure is disposed, the intermediate layer 4 is pressed by the convex structure, when pressure is applied in a vertical direction relative to the surfaces of the first electrode 2 and the second electrode 3. As a result, the intermediate layer 4 can be microscopically moved more notably in a horizontal direction relative to the surfaces of the first electrode 2 and the second electrode 3. Note that, examples of the electrode having the convex structure include a metal composite electrode (product name: Sui-10-70, manufactured by SEIREN Co., Ltd.). As the Sui-10-70 (manufactured by SEIREN Co., Ltd.) has a convex structure at the surface thereof, the Sui-10-70 can be suitably used.

<Intermediate Layer>

The intermediate layer is in contact with at least one of the first electrode and the second electrode. The intermediate layer moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode.

Note that, the state where the intermediate layer is not secured with at least one of the first electrode and the second electrode means a state where at least either the first electrode and the second electrode, or the intermediate layer can move. Even through the first electrode and the second electrode are secured with the intermediate layer at the peripheral parts thereof, the intermediate layer can move at least partially in a horizontal direction relative to the surfaces of the first electrode and the second electrode, as the first electrode and the second electrode, and the intermediate layer all have flexibility.

A material of the intermediate layer is appropriately selected depending on the intended purpose without any limitation. Examples of the material include rubber. Examples of the rubber include silicone rubber, fluorosilicone rubber, acrylic rubber, chloroprene rubber, natural rubber (latex), urethane rubber, fluorine rubber, and ethylene propylene rubber. Among these examples of the rubber, silicone rubber is preferable.

Filler may be added to the intermediate layer to impart various functions. Examples of the filler include titanium oxide, barium titanate, lead zirconate titanate, zinc oxide, silica, calcium carbonate, carbon black, carbon nanotube, carbon fiber, iron oxide, PTFE, mica, clay minerals, synthetic hydrotalcite, and metal. In the case where filler having piezoelectricity, or a polarized polymer (as a base material or filler) is used, a polarization treatment is preferably performed thereon.

The hardness (JIS-A hardness) of the intermediate layer is less than 60°, preferably less than 52°, and more preferably less than 42°. When the hardness is less than 60°, excellent electricity generation can be performed, as the hardness of the intermediate layer does not hinder the movement thereof.

The average thickness of the intermediate layer is appropriately selected depending on the intended purpose without any limitation. In view of deformability, the average thickness of the intermediate layer is preferably in a range of from 1 µm through 10 mm, and more preferably in a range of from 50 µm through 200 µm. When the average thickness is within the preferable range, a film formability can be secured, and deformation is not hindered, and therefore excellent electricity generation can be performed.

The intermediate layer preferably has insulation properties. As for the insulation properties, the intermediate layer preferably has the volume resistivity of $10^8$ Ωcm or greater, more preferably the volume resistivity of $10^{10}$ Ωcm or greater.

The intermediate layer may have a multilayer structure.

«Surface Modification Treatment and Deactivation Treatment»

Examples of a method for varying the amount of movement or the surface hardness of the intermediate layer include a surface modification treatment, and a deactivation treatment. Both of these treatments may be performed, or one of these treatments may be performed.

—Surface Modification Treatment—

Examples of the surface modification treatment include a plasma treatment, a corona discharge treatment, an electron-beam irradiation treatment, a UV-ray irradiation treatment, an ozone treatment, and a radial-ray (X-ray, α-ray, β-ray, γ-ray, or neutron) irradiation treatment. Among them, preferred in view of a processing speed are a plasma treatment, a corona discharge treatment, and an electron-beam irradiation treatment. However, the surface modification treatment is not limited to the aforementioned examples, as long as the surface modification treatment is a treatment where a certain degree of radiation energy is applied to a material to modify the material.

——Plasma Treatment——

In case of the plasma treatment, a plasma generating device is, for example, an atmospheric pressure plasma device, as well as a parallel-plate plasma device, a capacity-coupled plasma device, or an inductively-coupled plasma device. In view of durability, the plasma treatment is preferably a low-pressure plasma treatment.

The reaction pressure of the plasma treatment is appropriately selected depending on the intended purpose without any limitation. The reaction pressure is preferably in a range of from 0.05 Pa through 100 Pa, more preferably in a range of from 1 Pa through 20 Pa.

The reaction atmosphere of the plasma treatment is appropriately selected depending on the intended purpose without any limitation. For example, gas, such as inert gas, noble gas, and oxygen, is effective as the reaction atmosphere. The reaction atmosphere is preferably argon in view of continuity of an effect. Moreover, it is preferred that the oxygen partial pressure of the reaction atmosphere be adjusted to 5,000 ppm or less. When the oxygen partial pressure of the reaction atmosphere is 5,000 ppm or less, generation of ozone can be suppressed, and use of an ozone processing device can be avoided.

The electricity radiation does in the plasma treatment is defined by (output×irradiation duration). The electricity radiation does is preferably in a range of from 5 Wh through 200 Wh, more preferably in a range of from 10 Wh through 50 Wh. When the electricity radiation does within the aforementioned preferred range, an electricity generating function can be imparted to the intermediate layer, and durability can be maintained, as an excessive amount of the energy is not applied.

——Corona Discharge Treatment——

The applied energy (cumulative energy) in the corona discharge treatment is preferably in a range of from 6 J/cm² through 300 J/cm², more preferably in a range of from 12 J/cm² through 60 J/cm². When the applied energy is within the aforementioned preferred range, an electricity generating function can be imparted to the intermediate layer, and durability can be maintained, as irradiation is excessively performed.

——Electron-Beam Irradiation Treatment——

The radiation dose of the electron-beam irradiation treatment is preferably 1 kGy or greater, more preferably in a range of from 300 kGy through 10 MGy. When the radiation dose is within the aforementioned preferred range, an electricity generating function can be imparted to the intermediate layer, and durability can be maintained, as an excessive amount of the energy is not applied.

The reaction atmosphere of the electron-beam irradiation treatment is appropriately selected depending on the intended purpose without any limitation. The reaction atmosphere is preferably an atmosphere the oxygen partial pressure of which is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

——UV-Ray Irradiation Treatment——

UV rays used in the UV-ray irradiation treatment preferably have wavelengths of 365 nm or shorter but 200 nm or longer, more preferably 320 nm or shorter but 240 nm or longer.

The cumulative radiation of the UV-ray irradiation treatment is preferably in a range of from 5 J/cm² through 500 J/cm², more preferably in a range of from 50 J/cm² through 400 J/cm². When the cumulative radiation is within the aforementioned preferred range, an electricity generating function can be imparted to the intermediate layer, and durability can be maintained, as an excessive amount of the energy is not applied.

The reaction atmosphere of the UV-ray irradiation treatment is appropriately selected depending on the intended purpose without any limitation. The reaction atmosphere is preferably an atmosphere the oxygen partial pressure of which is adjusted to 5,000 ppm or less by filling with inert gas, such as argon, neon, helium, and nitrogen. When the oxygen partial pressure of the reaction atmosphere is 5,000 ppm or less, generation of ozone can be suppressed, and use of an ozone processing device can be avoided.

In the related art, proposed is that an interlayer adhesion is enhanced by exciting or oxidizing a material through a plasma treatment, a corona discharge treatment, a UV-ray irradiation treatment, or an electron-beam irradiation treatment, to thereby form active groups. However, these techniques are only limited to the application between layers, and are not suitable for an outermost surface, as lubricity are lowered. Moreover, a reaction of any of the aforementioned treatments performed in an oxygen-rich state, to effectively introduce reaction active groups (hydroxyl groups). Accordingly, the aforementioned related art is fundamentally different from the surface modification treatment performed in the present invention.

The surface modification treatment performed in the present invention is a treatment (e.g., a plasma treatment) that is performed in a reaction environment of a low oxygen content with reduced pressure. Therefore, the surface modification treatment accelerates re-crosslinking and bonding of the surface to improve durability, for example, owing to "an increase of Si—O bonds having high bonding energy," as well as improving lubricity owing to "high density because of an improved crosslinking density" (note that, active groups may be partially formed in the present invention, but the active groups are inactivated with the coupling agent described below, or by an air drying treatment).

The average thickness of the surface-treated layer obtained by the surface treatment is preferably in a range of from 0.01 μm through 50 μm, more preferably in a range of from 0.01 μm through 20.0 μm. When the average thickness is within the aforementioned preferable range, an ability of generating electricity can be imparted to the intermediate layer, and the intermediate layer is prevented from increasing the hardness thereof, to thereby prevent reduction in electricity generation.

—Deactivation Treatment—

A deactivation treatment may be appropriately performed on a surface of the intermediate layer using various materials.

The deactivation treatment is appropriately selected depending on the intended purpose without any limitation, provided that the deactivation treatment is a treatment capable of inactivating a surface of the intermediate layer. Examples thereof include a process including applying a deactivator onto a surface of the intermediate layer. The deactivation is to modify a surface of the intermediate layer to properties that hardly induce a chemical reaction by reducing activity of the surface of the intermediate layer. The activity of the surface of the intermediate layer is reduced by allowing active groups (e.g., —OH), which are generated by excitation or oxidation occurred in a plasma treatment, a corona discharge treatment, or an electron beam irradiation treatment, to react with the deactivator.

Examples of the deactivator include an amorphous resin, and a coupling agent.

Examples of the amorphous resin include a resin containing a perfluoropolyether structure in a principle chain thereof.

Examples of the coupling agent include metal alkoxide, and a solution containing metal alkoxide. Examples of the metal alkoxide include a compound represented by the following general formula (1), a partial hydrolysis polycondensation product thereof having a degree of polymerization in a range of from about 2 through about 10, and a mixture thereof.

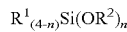
$$R^1_{(4-n)}Si(OR^2)_n \qquad \text{General Formula (1)}$$

In the general formula (1), $R^1$ and $R^2$ are each independently a straight chain or branched C1-C10 alkyl group, an alkyl polyether chain, or an aryl group, and n is an integer of 2, 3, or 4.

Specific example of the compound represented by the general formula (1) include dimethyl dimethoxysilane, diethyl diethoxysilane, diethyl dimethoxysilane, diethyl diethoxysilane, diphenyl dimethoxysilane, diphenyl diethoxysilane, methyl trimethoxysilane, methyl triethoxysilane, tetramethoxysilane, tetraethoxysilane, and tetrapropoxysilane. Among them, tetraethoxysilane is preferable in view of durability.

In the general formula (1), $R^1$ may be a fluoroalkyl group. Moreover, $R^1$ may be fluoroalkyl acrylate bonded via oxygen, or ether perfluoropolyether. Among them, a perfluoropolyether group is preferable in view of flexibility and durability.

Moreover, examples of the metal alkoxide include vinyl silanes [e.g., vinyltris(β-methoxyethoxy)silane, vinyltriethoxysilane, and vinyltrimethoxysilane], acryl silanes [e.g., γ-methacryloxypropyltrimethoxysilane], epoxy silanes [e.g., β-(3,4-epoxycyclohexyl)ethyltrimethoxysilane, γ-glycidoxypropyltrimethoxysilane, and γ-glycidoxypropylmethyldiethoxysilane], and aminosilanes [e.g., N-β(aminoethyl)γ-aminopropyltrimethoxysilane, N-β(aminoethyl)γ-aminopropylmethyldimethoxysilane, γ-aminopropyltriethoxysilane, and N-phenyl-γ-aminopropyltrimethoxysilane].

As for the metal alkoxide, moreover, other than Si, Ti, Sn, Al, and Zr may be used alone or in combination as metal atoms.

For example, the deactivation treatment can be carried out by applying the deactivator to a surface of the intermediate layer precursor through coating or dipping, after performing the surface modification treatment on the intermediate layer precursor, such as the rubber.

In the case where silicone rubber is used as the intermediate layer precursor, moreover, surface of the intermediate layer may be inactivated by leaving the intermediate layer to stand in the air, after performing the surface modification treatment.

«Space»

It is preferred that a space be disposed between the intermediate layer and at least one of the first electrode and the second electrode. As the space is disposed, the capacitance of the electric generating element changes even with weak vibrations, to thereby increase electricity generation.

A method for disposing the space is appropriately selected depending on the intended purpose without any limitation. Examples of the method include a method where a spacer is disposed between the intermediate layer and at least one of the first electrode and the second electrode.

—Spacer—

A material, form, shape, and size of the spacer are appropriately selected depending on the intended purpose without any limitation.

Examples of the material of the spacer include a polymer material, rubber, metal, a conductive polymer material, and a conductive rubber composition.

Examples of the polymer material include polyethylene, polypropylene, polyethylene terephthalate, polyvinyl chloride, a polyimide resin, a fluororesin, and an acrylic resin.

Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the metal include gold, silver, copper, aluminium, stainless steel, tantalum, nickel, and phosphor bronze.

Examples of the conductive polymer material include polythiophene, polyacetylene, and polyaniline.

Examples of the conductive rubber composition include a composition containing conductive filler and rubber. Examples of the conductive filler include a carbon material (e.g., Ketjenblack, acetylene black, graphite, carbon fiber, carbon fiber, carbon nanofiber, and carbon nanotubes), metal (e.g., gold, silver, platinum, copper, iron, aluminium, and nickel), a conductive polymer material (e.g., a derivative of any of polythiophene, polyacetylene, polyaniline, polypyrrole, poly(p-phenylene), and poly(p-phenylene)vinylene, and the derivative doped with a dopant, such as anions, and cations), and an ionic liquid. Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

Examples of the form of the spacer include a sheet, a film, a woven fabric, a non-woven fabric, a mesh, and a sponge.

The shape, size, thickness, and position to be disposed are appropriately selected depending on a structure of the electric generating element.

<Other Members>

Examples of the aforementioned other members include a sealing layer.

«Sealing Layer»

The sealing layer may be disposed on surfaces of the first electrode and the second electrode opposite to the surfaces thereof facing the intermediate layer.

The sealing layer is appropriately selected depending on the intended purpose without any limitation, and examples thereof include a cellophane tape.

It is preferred that the intermediate layer have no initial surface potential in the stationary state.

Note that, the initial surface potential in the stationary state can be measured under the following measuring conditions. Note that, the phrase "having no initial surface potential" means that the initial surface potential as measured under the following conditions is ±10 V or less.

[Measuring Conditions]

Pretreatment: After leaving a sample to stand in the atmosphere having the temperature of 30° C., and the relative humidity of 40% for 24 hours, neutralization is performed for 60 seconds (using SJ-F300, manufactured by Keyence Corporation)

Device: Treck Mode1344

Measuring probe: 6000B-7C

Measuring distance: 2 mm

Measuring spot diameter: 10 mm in diameter

The principle of electricity generation of the electric generating element of the present invention is different from those of the related art disclosed in Japanese Patent No. 5480414, Japanese Unexamined Patent Application Publication No. 2014-027756, and Japanese Patent No. 5126038, in that the intermediate layer of the electric generating element of the present invention does not have initial surface potential.

Electric materials used in the electric generating elements of the related art are materials to which electric charge has been semipermanently provided initially. The mechanism of electricity generation of the electric generating element of the present invention has not been yet clarified, but it is assumed as follows. As a load, such as an external force or vibrations, is applied, the intermediate layer adjacent to the electrode microscopically moves in a horizontal direction relative to surfaces of the first electrode and the second electrode, to thereby charge induced by friction charging, or generate electric charge inside the intermediate layer. As a result of the charging, a difference in surface potential is caused. The electric charge is moved to make the difference in the surface potential zero (0), to thereby generate electricity.

Figure 2:
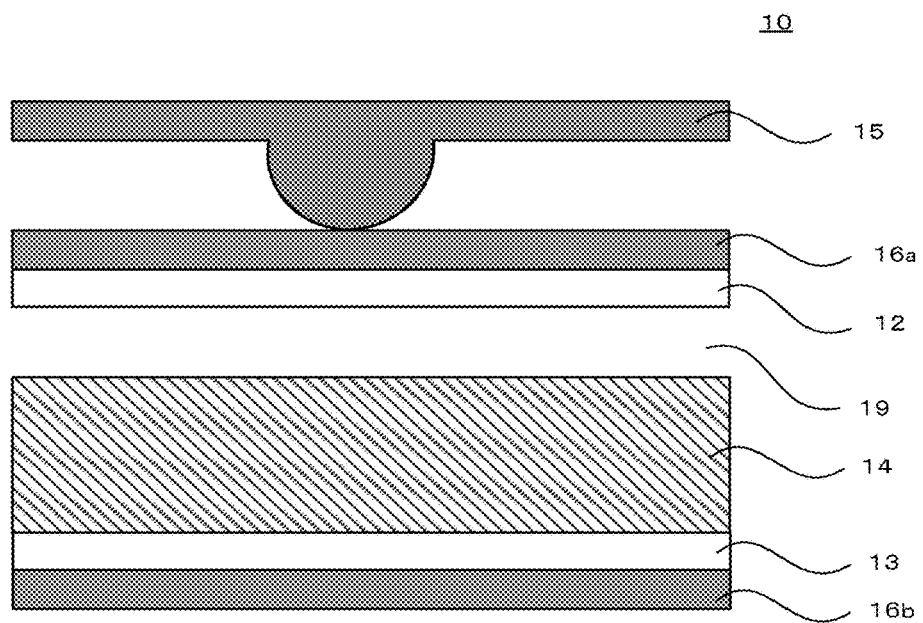
FIG. 2 is a schematic cross-sectional view illustrating another example of the electric generating element of the present invention.
Figure 3:
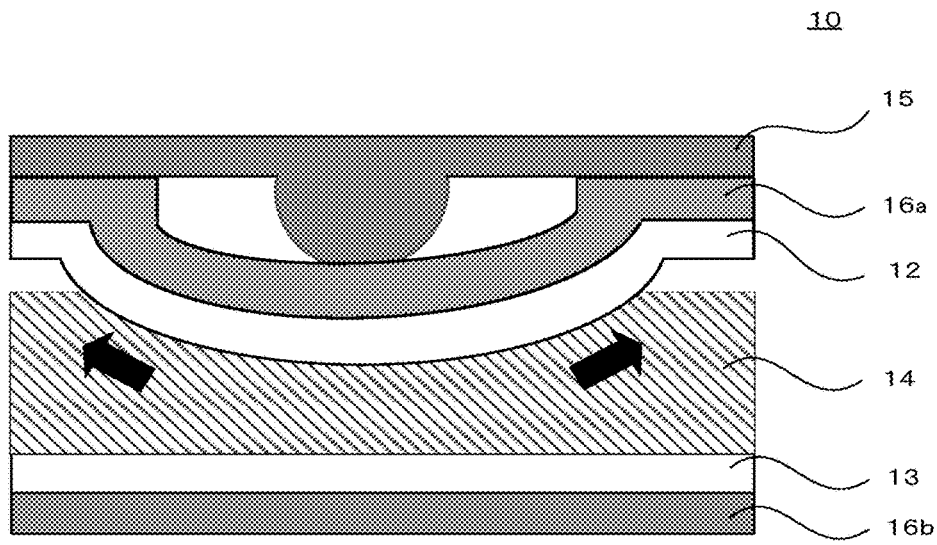
FIG. 3 is a schematic cross-sectional view illustrating a state where the electric generating element of FIG. 2 is pressed with a pressing member.

FIG. 2 is a schematic cross-sectional view illustrating another example of the electric generating element of the present invention. The electric generating element 10 illustrated in FIG. 2 contains a pressing member 15, a pair of electrodes (a first electrode 12 and a second electrode 13), an intermediate layer 14, and sealing layers 16a and 16b, and a space 19 is disposed between the first electrode and the intermediate layer via a spacer (not illustrated). FIG. 3 is a schematic cross-sectional view illustrating a state where the electric generating element of FIG. 2 is pressed with a pressing member. When pressure is applied vertically relative to surfaces of the first electrode and the second electrode using the pressing member 15 as illustrated in FIG. 3, the intermediate layer 14 is pressed via the first electrode having flexibility, to thereby microscopically move in a horizontal direction relative to the surfaces of the first electrode and the second electrode.

Figure 4:
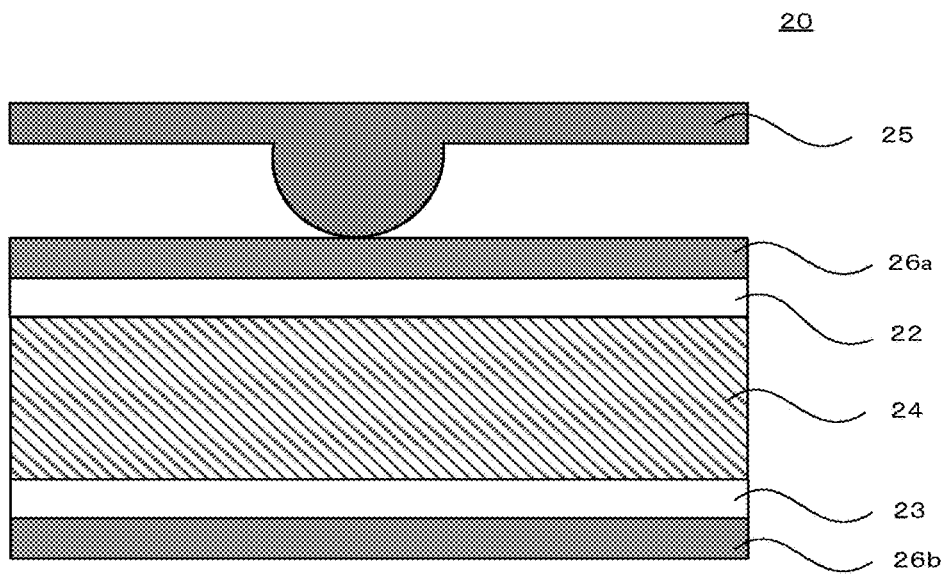
FIG. 4 is a schematic cross-sectional view illustrating another example of the electric generating element of the present invention.

FIG. 4 is a schematic cross-sectional view illustrating another example of the electric generating element of the present invention. The electric generating element 20 illustrated in FIG. 4 contains a pressing member 25, a pair of electrodes (a first electrode 22 and a second electrode 23), an intermediate layer 24, and sealing layers 26a and 26b, and does not have a space 19 as disposed in the electric generating element 10 of FIG. 3, and has a structure where the first electrode is in contact with the intermediate layer.

Figure 5:
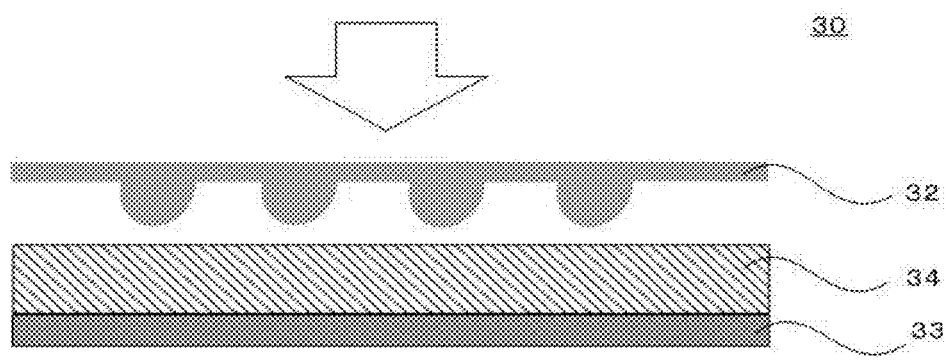
FIG. 5 is a schematic cross-sectional view illustrating another example of the electric generating element of the present invention.
Figure 6:
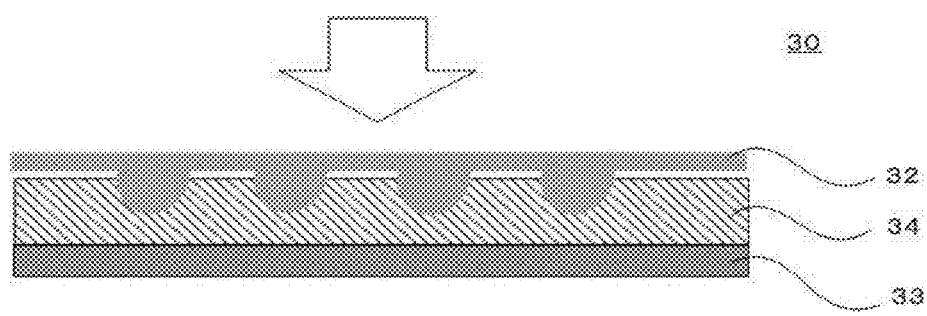
FIG. 6 is a schematic cross-sectional view illustrating a state where the pressing member of FIG. 5 is pressed in a vertical direction.

FIG. 5 is a schematic cross-sectional view illustrating another example of the electric generating element of the present invention. As illustrated in FIG. 5, the electric generating element 30 contains a first electrode 32, an intermediate layer 34, and a second electrode 33, and convex structures are disposed at a surface of the first electrode 32 facing the intermediate layer 34. FIG. 6 is a schematic cross-sectional view illustrating a state where pressure is applied in a vertical direction relative to the first electrode of FIG. 5. When the intermediate layer 34 is pressed with the convex structures disposed at the surface of the first electrode 32 of the electric generating element 30 facing the intermediate layer 34 as illustrated in FIG. 6, the intermediate layer 34 microscopically moves in a horizontal direction relative to the surfaces of the first electrode 32 and the second electrode 33.

(Electric Generator)

The electric generator of the present invention includes at least the electric generating element of the present invention, and may further include other members, if necessary. As the electric generator uses the electric generating element of the present invention, application of high voltage is not required at the time of operation.

The electric generator of the present invention generate electricity, as the intermediate layer of the electric generating element microscopically moves in a horizontal direction relative to surfaces of the first electrode and the second electrode, when a load is externally applied. The mechanism of electricity generation has not been yet clarified, but it is assumed as follows. As a load, such as an external force or vibrations, is applied, the intermediate layer adjacent to the electrode microscopically moves in a horizontal direction relative to surfaces of the first electrode and the second electrode, to thereby charge induced by friction charging, or generate electric charge inside the intermediate layer. As a result of the charging, a difference in surface potential is caused. The electric charge is moved to make the difference in the surface potential zero (0), to thereby generate electricity.

<Other Members>

Examples of the aforementioned other members include a cover material, an electrical wire, and an electric circuit.

—Cover Material—

The cover material is appropriately selected depending on the intended purpose without any limitation.

Examples of a material of the cover material include a polymer material, and rubber. Examples of the polymer material include polyethylene, polypropylene, polyethylene terephthalate, polyvinyl chloride, a polyimide resin, a fluororesin, and an acrylic resin. Examples of the rubber include silicone rubber, modified silicone rubber, acrylic rubber, chloroprene rubber, polysulfide rubber, urethane rubber, isobutyl rubber, fluorosilicone rubber, ethylene rubber, and natural rubber (latex).

A structure, shape, size, and thickness of the cover material are appropriately selected depending on the electric generator, without any limitation.

—Electrical Wire—

The electrical wire is appropriately selected depending on the intended purpose without any limitation.

Examples of a material of the electrical wire include metal and alloy. Examples of the metal include gold, silver, copper, aluminium, and nickel.

A structure, shape, and thickness of the electrical wire are appropriately selected depending on the electric generator without any limitation.

—Electric Circuit—

The electric circuit is appropriately selected depending on the intended purpose without any limitation, provided that the electric circuit is a circuit with which electricity generated in the electric generating element is drawn.

Examples of the electric circuit include a rectifier circuit, an oscilloscope, a voltmeter, an ammeter, a storage circuit, an LED, and various sensors (e.g., an ultrasonic sensor, a pressure sensor, a tactile sensor, a distortion sensor, an acceleration sensor, a shock sensor, a vibration sensor, a pressure-sensitive sensor, an electric field sensor, and a sound pressure sensor).

<Use>

For example, the electric generator is suitably used for various sensors, such as an ultrasonic sensor, a pressure sensor, a tactile sensor, a distortion sensor, an acceleration sensor, a shock sensor, a vibration sensor, a pressure-sensitive sensor, an electric field sensor, and a sound pressure sensor. Particularly, the electric generator is suitably used for a wearable sensor, as high voltage is not required. Moreover, the electric generator is suitably used as a piezoelectric film having excellent processability in a head phone, a speaker, a microphone, a hydrophone, a display, a fan, a pump, a variable focal lens, an ultrasonic transducer, a piezoelectric transformer, a sound insulator, a soundproofing material, an actuator, or a keyboard. Moreover, the electric generator can be used for an audio system, an information processing device, a measuring device, a medical device, a vehicle, a building, a damping material (damper) used for sports equipment, such as ski, and a racket, and other fields.

Furthermore, the electric generator is suitably used for the following applications.

Generation of electricity using natural energy, such as wave power, water power, and wind power.

Generation of electricity by walking by humans, when the electric generator is embedded in shoes, clothes, a floor, or accessories.

Generation of electricity using vibrations caused by traveling, when the electric generator is embedded in tires of automobiles.

Moreover, the electric generator is expected to be applied as a plate electric generator prepared by forming the electric generator on a flexible substrate, a secondary battery that is charged by applying voltage, or a novel actuator (e.g., artificial muscles).

Figure 7:
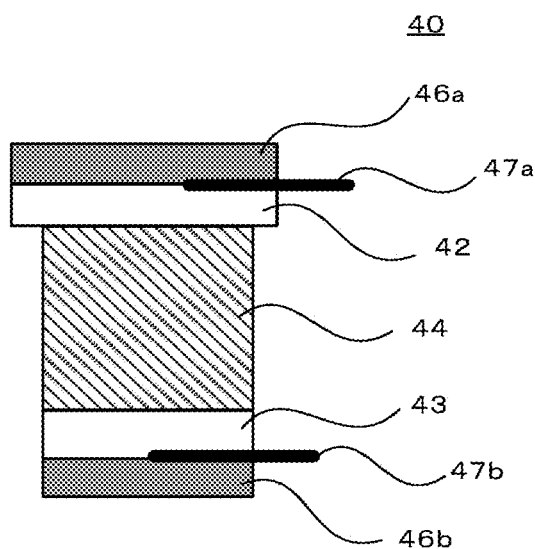
FIG. 7 is a schematic cross-sectional view of the electric generator of the present invention with which an influence of the movement to electricity generation is measured.

FIG. 7 is a schematic cross-sectional view of the electric generating element of the present invention for measuring an influence of the movement on electricity generation. In the structure illustrated, the structure of the movement facilitation was employed, and the electrode is directly moved. The electric generator 40 illustrated in FIG. 7 contains a pair of electrodes (a first electrode 42 and a second electrode 43), an intermediate layer 44, sealing layers 46a and 46b, and electric wires 47a and 47b.

Figure 8:
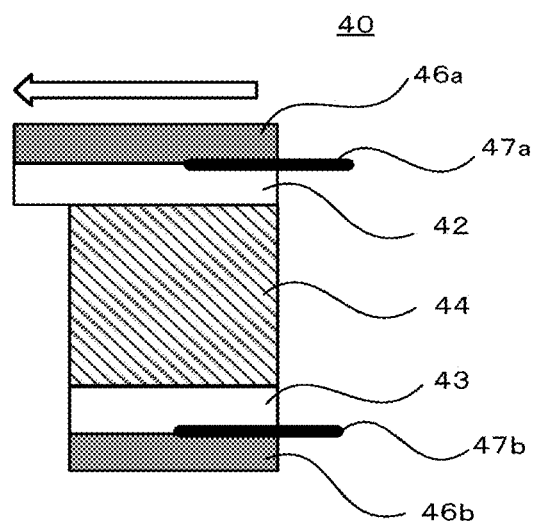
FIG. 8 is a schematic cross-sectional view illustrating a case where an upper electrode of the electric generator of FIG. 7 to be measured is moved to the left side.

FIG. 8 is a schematic cross-sectional view illustrating a case where the upper electrode of the electric generating element of FIG. 7 to be measured is moved to the left side.

Figure 9:
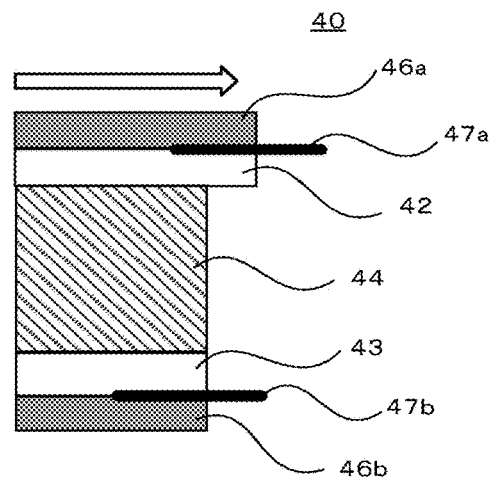
FIG. 9 is a schematic cross-sectional view illustrating a case where an upper electrode of the electric generator of FIG. 7 to be measured is moved to the right side.

FIG. 9 is a schematic cross-sectional view illustrating a case where the upper electrode of the electric generating element of FIG. 7 to be measured is moved to the right side. As illustrated in FIGS. 8 and 9, the upper electrode can be moved in the ether side of the horizontal direction, when pressure is applied in the vertical direction relative to surfaces of the first electrode and the second electrode.

«Determination of Movement in Horizontal Direction»

Figure 11:
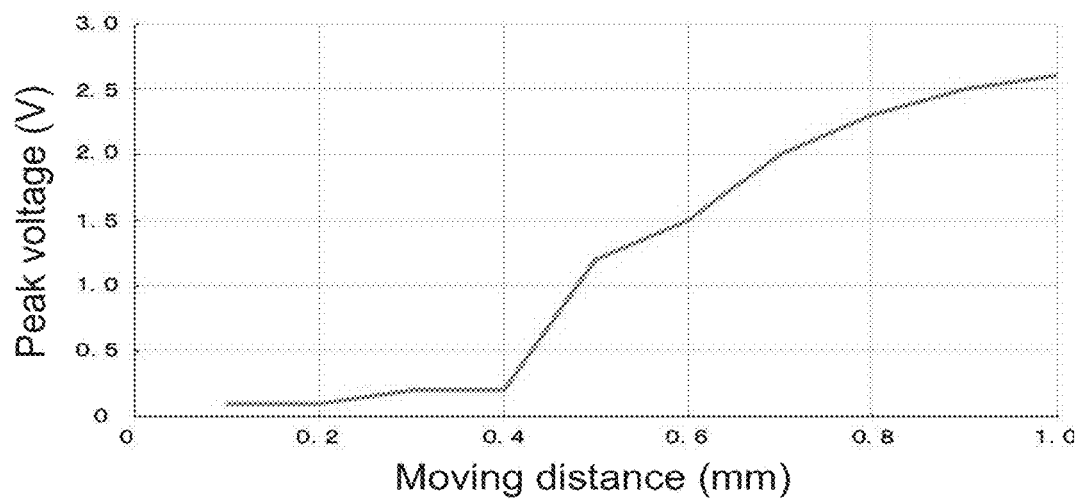
FIG. 11 is a graph depicting the measuring results of the electricity generation efficiency of the electric generator having the structure of FIG. 7.

The movement in the horizontal direction can be measured by pressing the electric generator having the structure of FIG. 7 to move in the horizontal direction using a surface tester (HEIDON Tribo Gear, 14DR) and a 30 mm flat indenter under the following measuring conditions, and measuring the peak voltage amount using an oscilloscope (WaveAce1001, manufactured by Teledyne LeCroy Japan Corporation). Note that, the surface tester can apply a load without moving the flat indenter, and can measure properties of a material, when the material moves in a horizontal direction along a movement of a stage that moves relatively. The structure that is an upper part of the electric generator from the first electrode is secured with the 30 mm flat indenter, and the part of the electric generator from the second electrode and below is secured with a movable stage below. As a result, an electricity generation performance of the electric generator when the intermediate layer is moved in a horizontal direction relative to a surface of the first electrode can be measured. FIG. 11 is a graph depicting the measurement result of the electricity generation efficiency of the electric generator having the structure of FIG. 7. The transverse axis of the graph depicts a moving distance, and the vertical axis of the graph depicts a peak value of the voltage. As demonstrated in the graph, the higher voltage can be attained with the larger amount of the movement.

Figure 10:
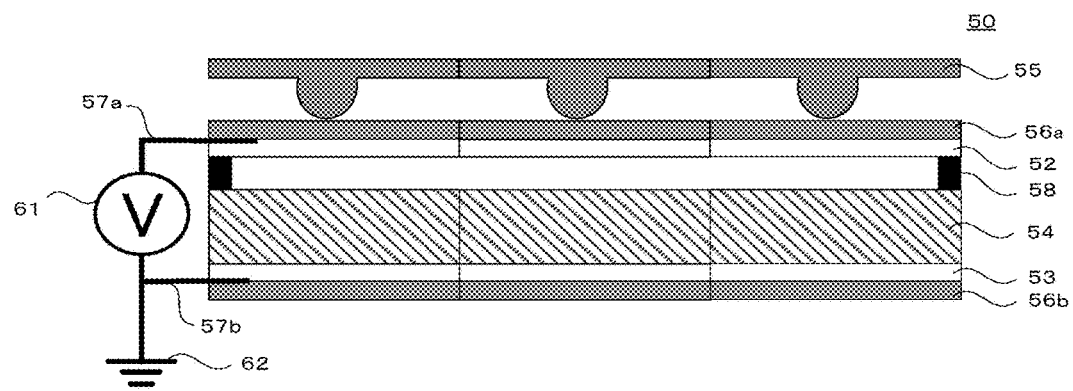
FIG. 10 is a schematic cross-sectional view illustrating another example of the electric generator of the present invention.

[Measuring Conditions]
Load: 100 gf
Traveling speed of table: returning at 1 mm/s FIG. 10 is a schematic cross-sectional view illustrating another example of the electric generator of the present invention. The electric generator 50 of FIG. 10 contains a plurality of the electric generating elements (a first electrode 52, a second electrode 53, an intermediate layer 54, sealing layers 56a and 56b, and a pressing member 55) of the present invention linked with each other. A spacer 58 is disposed between the first electrode 52 and the intermediate layer 54. Electric wires 57a and 57b, an intermediate layer piezoelectric meter 61, and an earth wire 62 are disposed. The output of electricity generation can be increased by linking a plurality of the electric generating elements.

EXAMPLES

Examples of the present invention are described hereinafter, but Examples below shall not be construed as to limit the scope of the present invention in any way. In Examples, "part(s)" denotes "part(s) by mass" and "%" denotes "% by mass," unless stated otherwise.

Example 1

<Production of Electric Generating Element>
«First Electrode and Second Electrode»
As for each of a first electrode and a second electrode, AL-PET 9-100 (thickness of aluminium foil: 12 µm) manufactured by PANAC CO., LTD. was provided.
«Formation of Intermediate Layer»
—Intermediate Layer Precursor—
Silicone Rubber A (TSE3033, manufactured by Momentive Performance Materials Inc.) was applied onto a polyethylene terephthalate (PET) film by blade coating to give an average thickness of 150 µm±20 µm, and a size of 50 mm (length)×70 mm (width), to thereby obtain an intermediate layer precursor.
—Surface Modification Treatment—
After baking the obtained intermediate layer precursor for 30 minutes at about 120° C., a plasma treatment was performed as a surface modification treatment, under the following conditions.
[Conditions of Plasma Treatment]
Device: PR-500, manufactured by Yamato Scientific Co., Ltd.
Output: 100 W
Processing time: 4 minutes
Reaction atmosphere: 99.999% argon
Reaction pressure: 10 Pa
—Deactivation Treatment—
After the surface modification treatment, a 0.1% solution prepared by diluting OPTOOL DSX (manufactured by DAIKIN INDUSTRIES, LTD.) serving as a fluorocarbon compound with perfluorohexane was applied onto the plasma-treated surface of the intermediate layer precursor by dip coating (Dip) at the withdrawing speed of 10 mm/min. Thereafter, the resultant was retained in the environment having the relative humidity of 90% and the temperature of 60° C. for 30 minutes or longer, followed by drying for 10 minutes at 50° C. to thereby perform a deactivation treatment.
Thereafter, the PET film was released.
In the manner as described above, an intermediate layer was attained.
<Production of Electric Generating Element>
The obtained intermediate layer was sandwiched with the first electrode and the second electrode, and lead wires (C3/RV-90 0.75SQ, manufactured by Taiyo Cabletec Corporation) were attached. To the resultant, a sealing layer was formed with a cellophane tape (No. 405 50 mm-width, manufactured by NICHIBAN CO., LTD.). Moreover, an aluminium pressing member, which had convex structures each having an approximate semi-circle cross-section, at the side of the first electrode, was disposed on a surface of the first electrode, to thereby produce an electric generating element of Example 1, which had the structure illustrated in FIG. 2. In the course of the production of the electric generating element, a piece of a conductive cloth tape (E05R1020, manufactured by SEIWA ELECTRIC MFG CO., LTD.) cut into the width of 5 mm was bonded parallel to the edge surface of the first electrode, which faced the intermediate layer, to give irregularities on the first electrode, to thereby create a structure where a space (air) was disposed between the first electrode and the intermediate layer. The space as mentioned was created by the thickness (about 0.12 mm) of the conductive cloth tape, but the space was changeable upon application of a load in the vertical direction. When no load was applied, the space was maintained.

As for the pressing member, moreover, an aluminium pressing member (product name: Aquare Ayame No. 1 (thin), manufactured by Saito Endiniazu Inc.) was used. In the pressing member, embossed convex structures were each a semi-circle in the cross-section and the semi-circle had the radius (150 µm±20 µm) identical to the average thickness (150 µm±20 µm) of the intermediate layer. The convex structures were arranged in the pressing member in the manner that the minimum distance between the edge of the convex structure to the edge of the adjacent convex structure was to be about 1,000 µm. Originally, the emboss processing is double-sided processing. However, the pressing member was described with omitting convex structures at the opposite side to the side thereof in contact with the rubber.
<Production of Electric Generator>
An oscilloscope (WaveAce1001, manufactured by Teledyne LeCroy Japan Corporation) was attached to the obtained electric generating element, to thereby produce an electric generator of Example 1 having the structure illustrated in FIG. 2.
<Evaluation>
«Hardness»
The hardness of the rubber of the intermediate layer was measured under the following measuring conditions. The result is presented in Table 1.
[Measuring Conditions]
Japanese Industrial Standards JIS K6253-3:2012, Rubber, vulcanized or thermoplastic—Determination of hardness—:
Type A durometer (JIS-A rubber hardness)
«Area Ratio (%) by Movement Facilitation Member»
An area of only a flat surface contact (e.g., AL-PET 9-100 in FIG. 12) was made was determined as 1. An effect of increasing an area by the pressing member or convex electrode for use in the present invention was determined as approximate to a case where a semi-oval was present on a flat surface.
A surface area S of the oval is as follows, when the oval is given with a radius a, radius b, and radius c.
The area ratio Sr by the movement facilitation member was determined by measuring a half of the surface area S, and replacing the halved value with the flat surface portion.

$$\text{Surface area } S = 2\pi \left[ c^2 + ab \times E(x, k) + \frac{bc^2}{ax} F(x, k) \right]$$

$$x = \sqrt{1 - \frac{c^2}{a^2}}, k = \frac{\sqrt{1 - \frac{c^2}{b^2}}}{x}, a \geq b \geq c$$

(with the proviso that F(x,k) is an elliptic integral of the first kind, and E(x,k) is an elliptic integral of the second kind)
An area SS of a unit structure, in case of a flat surface, is SS=2×(a×b).
Moreover, the "c" is a height. Accordingly, the approximate area including the convex is Sr=(S/2+(SS−a×b×π))/SS. The approximate area represented by percentage is presented in Table 5.
«Electricity Generation Performance»
An iron ball (weight: 200 g) was dropped on the produced electric generator of Example 1 from a position which was 10 cm height from the uppermost surface of the electric generator. The peak voltage amount as generated between the both electrodes was measured by the oscilloscope. The measurement was performed 5 times, and the obtained 5 measurements were averaged and the average value was provided as a measured value. The ratio of the measured value relative to the measured value of Comparative Example 7 was determined, and evaluated based on the following evaluation criteria. The result is presented in Table 5.

[Evaluation Criteria]
A: The value was 10 times or greater compared to Comparative Example 7, and the electricity generation performance was significantly improved.
B: The value was 5 times or greater but less than 10 times compared to Comparative Example 7, and the electricity generation performance was significantly improved.
C: The value was less than 5 times compared to Comparative Example 7, and the electricity generation performance was slightly improved.

Example 2

<Production of Electric Generating Element>
An electric generating element of Example 2 was produced in the same manner as in Example 1, provided that the reaction atmosphere (99.999% argon) was changed to nitrogen.
<Production of Electric Generator>
An electric generator of Example 2 was produced in the same manner as in Example 1, provided that the electric generating element produced in Example 1 was replaced with the electric generating element produced in Example 2.

Example 3

<Production of Electric Generating Element>
An electric generating element of Example 3 was produced in the same manner as in Example 1, provided that the reaction atmosphere (99.999% argon) was changed to oxygen.
<Production of Electric Generator>
An electric generator of Example 3 was produced in the same manner as in Example 1, provided that the electric generating element produced in Example 1 was replaced with the electric generating element produced in Example 3.

Example 4

<Production of Electric Generating Element>
An electric generating element of Example 4 was produced in the same manner as in Example 1, provided that the reaction atmosphere (99.999% argon) was changed to air.
<Production of Electric Generator>
An electric generator of Example 4 was produced in the same manner as in Example 1, provided that the electric generating element produced in Example 1 was replaced with the electric generating element produced in Example 4.

Example 5

<Production of Electric Generating Element>
An electric generating element of Example 5 was produced in the same manner as in Example 1, provided that the plasma treatment, which was the surface modification treatment, was changed to a corona discharge treatment, and the conditions of the plasma treatment were changed to the following conditions of the corona discharge treatment.
[Corona Discharge Treatment Conditions]
Applied voltage: 100 V
Cumulative energy: 500 J/cm$^2$
Reaction atmosphere: air
<Production of Electric Generator>
An electric generator of Example 5 was produced in the same manner as in Example 1, provided that the electric generating element produced in Example 1 was replaced with the electric generating element produced in Example 5.

Example 6

<Production of Electric Generating Element>
An electric generating element of Example 6 was produced in the same manner as in Example 1, provided that the plasma treatment, which was the surface modification treatment, was changed to an electron beam irradiation treatment, and the conditions of the plasma treatment were changed to the following conditions of the electron beam irradiation treatment.
[Electron Beam Irradiation Treatment Conditions]
Device: EB Engine (product name), manufactured by Hamamatsu Photonics K.K.
Radiation source: Line-irradiation low-energy electron beam light source
Radiation dose: 1 MGy
Reaction atmosphere: nitrogen (oxygen partial pressure: 5,000 ppm or less)
<Production of Electric Generator>
An electric generator of Example 6 was produced in the same manner as in Example 1, provided that the electric generating element produced in Example 1 was replaced with the electric generating element produced in Example 6.

Example 7

<Production of Electric Generating Element>
An electric generating element of Example 7, which had the structure where the first electrode and the intermediate layer were in contact with each other without any space as illustrated in FIG. 4, was produced in the same manner as in Example 1, provided that the conductive cloth tape serving as a spacer was not bonded to the edge of the surface of the first electrode facing the intermediate layer.
<Production of Electric Generator>
An electric generator of Example 7 was produced in the same manner as in Example 1, provided that the electric generating element produced in Example 1 was replaced with the electric generating element produced in Example 7.

Example 8

<Production of Electric Generating Element>
An electric generating element of Example 8, which had the structure where the first electrode and the intermediate layer were in contact with each other without any space as illustrated in FIG. 4, was produced in the same manner as in Example 2, provided that the conductive cloth tape serving as a spacer was not bonded to the edge of the surface of the first electrode facing the intermediate layer.
<Production of Electric Generator>
An electric generator of Example 8 was produced in the same manner as in Example 1, provided that the electric generating element produced in Example 1 was replaced with the electric generating element produced in Example 8.

Example 9

<Production of Electric Generating Element>

An electric generating element of Example 9, which had the structure where the first electrode and the intermediate layer were in contact with each other without any space as illustrated in FIG. 4, was produced in the same manner as in Example 3, provided that the conductive cloth tape serving as a spacer was not bonded to the edge of the surface of the first electrode facing the intermediate layer.

<Production of Electric Generator>

An electric generator of Example 9 was produced in the same manner as in Example 1, provided that the electric generating element produced in Example 1 was replaced with the electric generating element produced in Example 9.

Example 10

<Production of Electric Generating Element>

An electric generating element of Example 10, which had the structure where the first electrode and the intermediate layer were in contact with each other without any space as illustrated in FIG. 4, was produced in the same manner as in Example 4, provided that the conductive cloth tape serving as a spacer was not bonded to the edge of the surface of the first electrode facing the intermediate layer.

<Production of Electric Generator>

An electric generator of Example 10 was produced in the same manner as in Example 1, provided that the electric generating element produced in Example 1 was replaced with the electric generating element produced in Example 10.

Example 11

<Production of Electric Generating Element>

An electric generating element of Example 11, which had the structure where the first electrode and the intermediate layer were in contact with each other without any space as illustrated in FIG. 4, was produced in the same manner as in Example 5, provided that the conductive cloth tape serving as a spacer was not bonded to the edge of the surface of the first electrode facing the intermediate layer.

<Production of Electric Generator>

An electric generator of Example 11 was produced in the same manner as in Example 1, provided that the electric generating element produced in Example 1 was replaced with the electric generating element produced in Example 11.

Example 12

<Production of Electric Generating Element>

An electric generating element of Example 12, which had the structure where the first electrode and the intermediate layer were in contact with each other without any space as illustrated in FIG. 4, was produced in the same manner as in Example 6, provided that the conductive cloth tape serving as a spacer was not bonded to the edge of the surface of the first electrode facing the intermediate layer.

<Production of Electric Generator>

An electric generator of Example 12 was produced in the same manner as in Example 1, provided that the electric generating element produced in Example 1 was replaced with the electric generating element produced in Example 12.

Example 13

<Production of Electric Generating Element>

An electric generating element of Example 13 was produced in the same manner as in Example 1, provided that Silicone Rubber A (TSE3033, manufactured by Momentive Performance Materials Inc.) was replaced with Silicone Rubber B (KE-1950-20, manufactured by Shin-Etsu Chemical Co., Ltd.).

<Production of Electric Generator>

An electric generator of Example 13 was produced in the same manner as in Example 1, provided that the electric generating element produced in Example 1 was replaced with the electric generating element produced in Example 13.

Example 14

<Production of Electric Generating Element>

An electric generating element of Example 14 was produced in the same manner as in Example 1, provided that Silicone Rubber A (TSE3033, manufactured by Momentive Performance Materials Inc.) was replaced with Silicone Rubber C (KE-1950-30, manufactured by Shin-Etsu Chemical Co., Ltd.).

<Production of Electric Generator>

An electric generator of Example 14 was produced in the same manner as in Example 1, provided that the electric generating element produced in Example 1 was replaced with the electric generating element produced in Example 14.

Example 15

<Production of Electric Generating Element>

An electric generating element of Example 15 was produced in the same manner as in Example 1, provided that Silicone Rubber A (TSE3033, manufactured by Momentive Performance Materials Inc.) was replaced with Silicone Rubber D (KE-1950-40, manufactured by Shin-Etsu Chemical Co., Ltd.).

<Production of Electric Generator>

An electric generator of Example 15 was produced in the same manner as in Example 1, provided that the electric generating element produced in Example 1 was replaced with the electric generating element produced in Example 15.

Example 16

<Production of Electric Generating Element>

An electric generating element of Example 16 was produced in the same manner as in Example 1, provided that Silicone Rubber A (TSE3033, manufactured by Momentive Performance Materials Inc.) was replaced with Silicone Rubber E (KE-1950-50, manufactured by Shin-Etsu Chemical Co., Ltd.).

<Production of Electric Generator>

An electric generator of Example 16 was produced in the same manner as in Example 1, provided that the electric generating element produced in Example 1 was replaced with the electric generating element produced in Example 16.

Example 17

<Production of Electric Generating Element>
«First Electrode and Second Electrode»

As for a first electrode, a metal composite electrode (product name: Sui-10-70, SEIREN Co., Ltd.) was provided. The Sui-10-70 was plain fabrics. The surface thereof was observed under a laser microscope (product name: VK9500, manufactured by Keyence Corporation). It was confirmed that there were semicylindrical protrusions each in the size of about 30 μm, and the protrusions were dispersed at the pitch of 400 μm.

AL-PET 9-100 (thickness of aluminium foil: 12 μm) manufactured by PANAC Corporation was used as a second electrode.

«Formation of Intermediate Layer»

An intermediate layer was obtained in the same manner as in Example 1.

<Production of Electric Generating Element>

The obtained intermediate layer was sandwiched with the first electrode and the second electrode, and lead wires (C3/RV-90 0.75SQ, manufactured by Taiyo Cabletec Corporation) were attached. To the resultant, a sealing layer was formed with a cellophane tape (No. 405 50 mm-width, manufactured by NICHIBAN CO., LTD.), to thereby produce an electric generating element of Example 17. In the course of the production of the electric generating element, pieces of a conductive cloth tape (E05R1020, manufactured by SEIWA ELECTRIC MFG CO., LTD.) each cut into the width of 5 mm were bonded parallel to the edge surface of the first electrode, which faced the intermediate layer, to give irregularities on the first electrode, to thereby create a structure where a space (air) was disposed between the first electrode and the intermediate layer. The space as mentioned was created by the total thickness of the two laminated pieces of the conductive cloth tape (about 0.24 mm, thickness of each piece of the conductive cloth tape: 0.12 mm). The space was changeable upon application of a load in the vertical direction. When no load was applied, the space was maintained.

<Production of Electric Generator>

An oscilloscope (WaveAce1001, manufactured by Teledyne LeCroy Japan Corporation) was attached to the obtained electric generating element, to thereby produce an electric generator of Example 17 having the structure illustrated in FIG. 5.

Example 18

<Production of Electric Generating Element>
«First Electrode and Second Electrode»

Conical convex structures each having a height of 0.1 mm were disposed on a nickel plate having a thickness of 0.5 mm by electrocasting in the manner that the minimum distance between the edge of the convex structure and the edge of the adjacent convex structure was to be 0.2 mm, whereby a first electrode was obtained.

AL-PET 9-100 (thickness of aluminium foil: 12 μm) manufactured by PANAC CO., LTD. was used as a second electrode.

«Formation of Intermediate Layer»

An intermediate layer was obtained in the same manner as in Example 1.

<Production of Electric Generating Element>

The obtained intermediate layer was sandwiched with the first electrode and the second electrode, and lead wires (C3/RV-90 0.75SQ, manufactured by Taiyo Cabletec Corporation) were attached. To the resultant, a sealing layer was formed with a cellophane tape (No. 405 50 mm-width, manufactured by NICHIBAN CO., LTD.), to thereby produce an electric generating element of Example 18. In the course of the production of the electric generating element, a piece of a conductive cloth tape (E05R1020, manufactured by SEIWA ELECTRIC MFG CO., LTD.) cut into the width of 5 mm was bonded parallel to the edge surface of the first electrode, which faced the intermediate layer, to give irregularities on the first electrode, to thereby create a structure where a space (air) was disposed between the first electrode and the intermediate layer. The space as mentioned was created by the thickness (about 0.12 mm) of the conductive cloth tape, but the space was changeable upon application of a load in the vertical direction. When no load was applied, the space was maintained.

<Production of Electric Generator>

An oscilloscope (WaveAce1001, manufactured by Teledyne LeCroy Japan Corporation) was attached to the obtained electric generating element, to thereby produce an electric generator of Example 18 having the structure illustrated in FIG. 1.

Comparative Example 1

<Production of Electric Generating Element>

Figure 12:
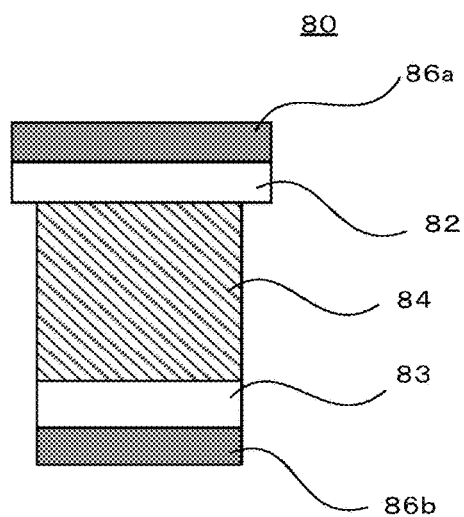
FIG. 12 is a schematic cross-sectional view illustrating the electric generating element produced in Comparative Example 1.

An electric generating element of Comparative Example 1 having the structure illustrated in FIG. 12 was produced in the same manner as in Example 1, provided that the intermediate layer was sandwiched between the first electrode and the second electrode without any gap and the intermediate layer was in contact with the first electrode and with the second electrode from the beginning. In this structure, all the layers were in contact with each other from the beginning, hence a charging effect exhibited when the electrodes were set apart was small. The electric generating element 80 of FIG. 12 contained a pair of the electrodes (the first electrode 82, and the second electrode 83), the intermediate layer 84, and the sealing layers 86a and 86b.

<Production of Electric Generator>

An electric generator of Comparative Example 1 was produced in the same manner as in Example 1, provided that the electric generating element produced in Example 1 was replaced with the electric generating element produced in Comparative Example 1.

Comparative Example 2

<Production of Electric Generating Element>

An electric generating element of Comparative Example 2 was produced in the same manner as in Comparative Example 1, provided that the reaction atmosphere (99.999% argon) was changed to nitrogen.

<Production of Electric Generator>

An electric generator of Comparative Example 2 was produced in the same manner as in Example 1, provided that the electric generating element produced in Example 1 was replaced with the electric generating element produced in Comparative Example 2.

Comparative Example 3

<Production of Electric Generating Element>

An electric generating element of Comparative Example 3 was produced in the same manner as in Comparative Example 1, provided that the reaction atmosphere (99.999% argon) was changed to oxygen.

<Production of Electric Generator>

An electric generator of Comparative Example 3 was produced in the same manner as in Example 1, provided that the electric generating element produced in Example 1 was replaced with the electric generating element produced in Comparative Example 3.

Comparative Example 4

<Production of Electric Generating Element>

An electric generating element of Comparative Example 4 was produced in the same manner as in Comparative Example 1, provided that the reaction atmosphere (99.999% argon) was changed to air.

<Production of Electric Generator>

An electric generator of Comparative Example 4 was produced in the same manner as in Example 1, provided that the electric generating element produced in Example 1 was replaced with the electric generating element produced in Comparative Example 4.

Comparative Example 5

<Production of Electric Generating Element>

An electric generating element of Comparative Example 5 was produced in the same manner as in Comparative Example 1, provided that the plasma treatment, which was the surface modification treatment, was changed to a corona discharge treatment, and the conditions of the plasma treatment were changed to the following conditions of the corona discharge treatment.

[Corona Discharge Treatment Conditions]
Applied voltage: 100 V
Cumulative energy: 500 J/cm$^2$
Reaction atmosphere: air <Production of Electric Generator>

An electric generator of Comparative Example 5 was produced in the same manner as in Example 1, provided that the electric generating element produced in Example 1 was replaced with the electric generating element produced in Comparative Example 5.

Comparative Example 6

<Production of Electric Generating Element>

An electric generating element of Comparative Example 6 was produced in the same manner as in Comparative Example 1, provided that the plasma treatment, which was the surface modification treatment, was changed to an electron beam irradiation treatment, and the conditions of the plasma treatment were changed to the following conditions of the electron beam irradiation treatment.

[Electron Beam Irradiation Treatment Conditions]
Device: EB Engine (product name), manufactured by Hamamatsu Photonics K.K.
Radiation source: Line-irradiation low-energy electron beam light source
Radiation dose: 1 MGy
Reaction atmosphere: nitrogen (oxygen partial pressure: 5,000 ppm or less)

<Production of Electric Generator>

An electric generator of Comparative Example 6 was produced in the same manner as in Example 1, provided that the electric generating element produced in Example 1 was replaced with the electric generating element produced in Comparative Example 6.

Comparative Example 7

<Production of Electric Generating Element>

An electric generating element of Comparative Example 7 was produced in the same manner as in Comparative Example 1, provided that the surface modification treatment was not performed.

<Production of Electric Generator>

An electric generator of Comparative Example 7 was produced in the same manner as in Example 1, provided that the electric generating element produced in Example 1 was replaced with the electric generating element produced in Comparative Example 7.

Comparative Example 8

<Production of Electric Generating Element>

An electric generating element of Comparative Example 8 was produced in the same manner as in Example 1, provided that Silicone Rubber A (TSE3033, manufactured by Momentive Performance Materials Inc.) was replaced with Silicone Rubber F (KE-1950-60, manufactured by Shin-Etsu Chemical Co., Ltd.).

<Production of Electric Generator>

An electric generator of Comparative Example 8 was produced in the same manner as in Example 1, provided that the electric generating element produced in Example 1 was replaced with the electric generating element produced in Comparative Example 8.

Comparative Example 9

<Production of Electric Generating Element>

An electric generating element of Comparative Example 9 was produced in the same manner as in Example 1, provided that Silicone Rubber A (TSE3033, manufactured by Momentive Performance Materials Inc.) was replaced with Silicone Rubber G (KE-1950-70, manufactured by Shin-Etsu Chemical Co., Ltd.).

<Production of Electric Generator>

An electric generator of Comparative Example 9 was produced in the same manner as in Example 1, provided that the electric generating element produced in Example 1 was replaced with the electric generating element produced in Comparative Example 9.

The compositions of the intermediate layers of Examples 1 to 18, and Comparative Examples 1 to 9, and the structures of the electric generating elements of Examples 1 to 18, and Comparative Examples 1 to 9 are summarized in Tables 1 to 4.

The electric generating elements and electric generators obtained in Examples 2 to 18, and Comparative Examples 1 to 9 were evaluated in the same manner as in Example 1. The evaluation results of Examples 1 to 18, and Comparative Examples 1 to 9 are presented in Tables 1 to 5.

TABLE 1

| | | Intermediate layer | | Surface modification treatment | |
|---|---|---|---|---|---|
| | | Material | Hardness (°) | Method | Reaction gas |
| Example | 1 | Silicone Rubber A | 30 | Plasma treatment | Argon |
| | 2 | Silicone Rubber A | 30 | Plasma treatment | Nitrogen |
| | 3 | Silicone Rubber A | 30 | Plasma treatment | Oxygen |
| | 4 | Silicone Rubber A | 30 | Plasma treatment | Air |
| | 5 | Silicone Rubber A | 30 | Corona discharge | Air |
| | 6 | Silicone Rubber A | 30 | Electron beam irradiation | Nitrogen + Oxygen (5,000 ppm or less) |
| | 7 | Silicone Rubber A | 30 | Plasma treatment | Argon |
| | 8 | Silicone Rubber A | 30 | Plasma treatment | Nitrogen |
| | 9 | Silicone Rubber A | 30 | Plasma treatment | Oxygen |
| | 10 | Silicone Rubber A | 30 | Plasma treatment | Air |
| | 11 | Silicone Rubber A | 30 | Corona discharge | Air |
| | 12 | Silicone Rubber A | 30 | Electron beam irradiation | Nitrogen + Oxygen (5,000 ppm or less) |
| | 13 | Silicone Rubber B | 20 | Plasma treatment | Argon |
| | 14 | Silicone Rubber C | 32 | Plasma treatment | Argon |
| | 15 | Silicone Rubber D | 42 | Plasma treatment | Argon |
| | 16 | Silicone Rubber E | 52 | Plasma treatment | Argon |
| | 17 | Silicone Rubber A | 30 | Plasma treatment | Argon |
| | 18 | Silicone Rubber A | 30 | Plasma treatment | Argon |

TABLE 2

| | | Electrode | | Electric generator | | |
|---|---|---|---|---|---|---|
| | | First electrode | Second electrode | Film thickness (μm) | Structure | Presence of space |
| Example | 1 | AL-PET 9-100 | AL-PET 9-100 | 12 | FIG. 2 | Yes |
| | 2 | AL-PET 9-100 | AL-PET 9-100 | 12 | FIG. 2 | Yes |
| | 3 | AL-PET 9-100 | AL-PET 9-100 | 12 | FIG. 2 | Yes |
| | 4 | AL-PET 9-100 | AL-PET 9-100 | 12 | FIG. 2 | Yes |
| | 5 | AL-PET 9-100 | AL-PET 9-100 | 12 | FIG. 2 | Yes |
| | 6 | AL-PET 9-100 | AL-PET 9-100 | 12 | FIG. 2 | Yes |
| | 7 | AL-PET 9-100 | AL-PET 9-100 | 12 | FIG. 4 | No |
| | 8 | AL-PET 9-100 | AL-PET 9-100 | 12 | FIG. 4 | No |
| | 9 | AL-PET 9-100 | AL-PET 9-100 | 12 | FIG. 4 | No |
| | 10 | AL-PET 9-100 | AL-PET 9-100 | 12 | FIG. 4 | No |
| | 11 | AL-PET 9-100 | AL-PET 9-100 | 12 | FIG. 4 | No |
| | 12 | AL-PET 9-100 | AL-PET 9-100 | 12 | FIG. 4 | No |
| | 13 | AL-PET 9-100 | AL-PET 9-100 | 12 | FIG. 2 | Yes |
| | 14 | AL-PET 9-100 | AL-PET 9-100 | 12 | FIG. 2 | Yes |
| | 15 | AL-PET 9-100 | AL-PET 9-100 | 12 | FIG. 2 | Yes |
| | 16 | AL-PET 9-100 | AL-PET 9-100 | 12 | FIG. 2 | Yes |
| | 17 | Sui-10-70 | AL-PET 9-100 | — | FIG. 5 | Yes |
| | 18 | Electro-casting nickel | AL-PET 9-100 | — | FIG. 1 | Yes |

TABLE 3

| | | Intermediate layer | | Surface modification treatment | |
|---|---|---|---|---|---|
| | | Material | Hardness (°) | Method | Reaction gas |
| Comp. Ex. | 1 | Silicone Rubber A | 30 | Plasma treatment | Argon |
| | 2 | Silicone Rubber A | 30 | Plasma treatment | Nitrogen |
| | 3 | Silicone Rubber A | 30 | Plasma treatment | Oxygen |
| | 4 | Silicone Rubber A | 30 | Plasma treatment | Air |
| | 5 | Silicone Rubber A | 30 | Corona discharge | Air |
| | 6 | Silicone Rubber A | 30 | Electron beam irradiation | Nitrogen + Oxygen (5,000 ppm or less) |
| | 7 | Silicone Rubber A | 30 | — | — |

TABLE 3-continued

| | | Intermediate layer | | |
|---|---|---|---|---|
| | | | Surface modification treatment | |
| | Material | Hardness (°) | Method | Reaction gas |
| 8 | Silicone Rubber F | 60 | Plasma treatment | Argon |
| 9 | Silicone Rubber G | 70 | Plasma treatment | Argon |

TABLE 4

| | | Electrode | | Electric generator | |
|---|---|---|---|---|---|
| | | First electrode | Second electrode | Film thickness (μm) | Structure | Presence of space |
| Comp. Ex. | 1 | AL-PET 9-100 | AL-PET 9-100 | 12 | FIG. 12 | No |
| | 2 | AL-PET 9-100 | AL-PET 9-100 | 12 | FIG. 12 | No |
| | 3 | AL-PET 9-100 | AL-PET 9-100 | 12 | FIG. 12 | No |
| | 4 | AL-PET 9-100 | AL-PET 9-100 | 12 | FIG. 12 | No |
| | 5 | AL-PET 9-100 | AL-PET 9-100 | 12 | FIG. 12 | No |
| | 6 | AL-PET 9-100 | AL-PET 9-100 | 12 | FIG. 12 | No |
| | 7 | AL-PET 9-100 | AL-PET 9-100 | 12 | FIG. 12 | No |
| | 8 | AL-PET 9-100 | AL-PET 9-100 | 12 | FIG. 2 | Yes |
| | 9 | AL-PET 9-100 | AL-PET 9-100 | 12 | FIG. 2 | Yes |

TABLE 5

| | | Intermediate layer | | | Evaluation result Electricity generation ability | |
|---|---|---|---|---|---|---|
| | | Area ratio by movement facilitation member (%) | | | | |
| | | Flat surface | facilitation member | Movement | Voltage ratio | Evaluation |
| Ex. | 1 | 100 | 114 | Yes | 16 | A |
| | 2 | 100 | 114 | Yes | 15 | A |
| | 3 | 100 | 114 | Yes | 14 | A |
| | 4 | 100 | 114 | Yes | 10 | A |
| | 5 | 100 | 114 | Yes | 10 | A |
| | 6 | 100 | 114 | Yes | 10 | A |
| | 7 | 100 | 114 | Yes | 8 | B |
| | 8 | 100 | 114 | Yes | 7 | B |
| | 9 | 100 | 114 | Yes | 7 | B |
| | 10 | 100 | 114 | Yes | 6 | B |
| | 11 | 100 | 114 | Yes | 6 | B |
| | 12 | 100 | 114 | Yes | 6 | B |
| | 13 | 100 | 114 | Yes | 17 | A |
| | 14 | 100 | 114 | Yes | 16 | A |
| | 15 | 100 | 114 | Yes | 16 | A |
| | 16 | 100 | 114 | Yes | 12 | A |
| | 17 | 100 | 114 | Yes | 16 | A |
| | 18 | 100 | 179 | Yes | 15 | A |
| Comp. Ex. | 1 | 100 | 100 | No | 4 | C |
| | 2 | 100 | 100 | No | 3 | C |
| | 3 | 100 | 100 | No | 3 | C |
| | 4 | 100 | 100 | No | 3 | C |
| | 5 | 100 | 100 | No | 3 | C |
| | 6 | 100 | 100 | No | 3 | C |
| | 7 | 100 | 100 | No | 1 | C |
| | 8 | 100 | 114 | Yes | 4 | C |
| | 9 | 100 | 114 | Yes | 1 | C |

It was found from the results of Table 5 that electricity generation performances were improved in Examples 1 to 6 compared to Comparative Examples 1 to 7, as each of the electric generating elements of Examples 1 to 6 had a structure where the intermediate layer was movable in a horizontal direction relative to surfaces of the first electrode and the second electrode, and the space was disposed between the first electrode and the intermediate layer.

Moreover, it was found that electricity generation performances were improved in Examples 7 to 12 compared to Comparative Examples 1 to 7, as each of the electric generating elements of Examples 7 to 12 had a structure where the intermediate layer was movable in a horizontal direction relative to surfaces of the first electrode and the second electrode. Moreover, it was found that electricity generation performances were also high in Examples 17 and 18 where the electric generating element was another structure, in which the intermediate layer was movable in a horizontal direction relative to surfaces of the first electrode and the second electrode.

Next, it was found that the electricity generation performance was high in all of Examples 1 to 18 where the rubber strength was less than 60°, compared to Comparative Examples 8 and 9. It is assumed that the pressing member does not effectively penetrate into the rubber when the rubber hardness is high.

It was found from the results above that the electric generating element and electric generator of the present invention did not require application of high voltage at the time of operation, and exhibited a high electricity generation performance by moving the intermediate layer in a horizontal direction relative to surfaces of the first electrode and the second electrode. Moreover, it was found that the electric generating element and electric generator of the present invention did not break when a load is applied externally.

For example, the embodiments of the present invention are as follows.

<1> An electric generating element including:
a first electrode;
an intermediate layer; and
a second electrode, the first electrode, the intermediate layer, and the second electrode being disposed in this order, the intermediate layer being in contact with at least one of the first electrode and the second electrode, wherein the intermediate layer microscopically moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode.

<2> The electric generating element according to <1>, wherein hardness of the intermediate layer measured by a type A durometer is less than 60°.

<3> The electric generating element according to <1> or <2>, wherein the intermediate layer contains a silicone rubber composition including silicone rubber.

<4> The electric generating element according to any one of <1> to <3>, wherein a space is disposed between the intermediate layer and at least one of the first electrode and the second electrode.

<5> The electric generating element according to any one of <1> to <4>, wherein the intermediate layer of a stationary state has no surface charge.

<6> The electric generating element according to any one of <1> to <5>, wherein a convex structure is formed at a surface of at least one the first electrode and the second electrode, the surface being in contact with the intermediate layer.

<7> The electric generating element according to any one of <1> to <5>, wherein a pressing member is disposed at a surface of the first electrode opposite to a surface of the first electrode facing the intermediate layer.

<8> The electric generating element according to any one of <1> to <7>, wherein the intermediate layer has been subjected to a surface modification treatment.

<9> The electric generating element according to <8>, wherein the surface modification treatment is a plasma treatment, a corona discharge treatment, or an electron-beam irradiation treatment.

<10> The electric generating element according to any one of <1> to <9>, wherein an average thickness of the intermediate layer in a range of from 1 μm through 10 mm.

<11> The electric generating element according to any one of <1> to <10>, wherein an average thickness of the first electrode is in a range of from 0.01 μm through 1 mm.

<12> The electric generating element according to any one of <1> to <11>, wherein an average thickness of the second electrode is in a range of from 0.01 μm through 1 mm.

<13> The electric generating element according to any one of <1> to <12>, wherein volume resistivity of the intermediate layer is $10^8$ Ωcm or greater.

<14> The electric generating element according to any one of <1> to <13>, wherein volume resistivity of the intermediate layer is $10^{10}$ Ωcm or greater.

<15> The electric generating element according to any one of <1> to <14>, wherein a coefficient of kinetic friction of the first electrode is 1.5 or less.

<16> The electric generating element according to any one of <1> to <15>, wherein a coefficient of kinetic friction of the second electrode is 1.5 or less.

<17> The electric generating element according to any one of <1> to <16>, wherein an average thickness of the intermediate layer is in a range of from 50 μm through 200 μm.

<18> The electric generating element according to any one of <1> to <17>, wherein hardness of the intermediate layer measured by a type A durometer is 52° or less.

<19> The electric generating element according to any one of <1> to <18>, wherein a coefficient of kinetic friction of the first electrode is 0.8 or less.

<20> An electric generator including the electric generating element according to any one of <1> to <19>.

The electric generating element according any one of <1> to <19>, and the electric generator according <20> can solve the aforementioned various problem in the art, and can achieve the object of the present invention.

What is claimed is:

1. An electric generating element, comprising:
   a pressing member;
   a first electrode;
   an intermediate layer; and
   a second electrode,
   the first electrode, the intermediate layer, and the second electrode being disposed in this order, and
   the intermediate layer being in contact with at least one of the first electrode and the second electrode,
   wherein:
   the pressing member is affixed to:
   a surface of the first electrode opposite to a surface of the first electrode facing the intermediate layer, or
   a surface of a sealing layer opposite to a surface of the sealing layer facing the first electrode, in which the sealing layer, the first electrode, the intermediate layer and the second electrode are disposed in this order; and
   the intermediate layer microscopically moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode.

2. The electric generating element according to claim 1, wherein a hardness of the intermediate layer measured by a type A durometer is less than 60°.

3. The electric generating element according to claim 1, wherein the intermediate layer comprises a silicone rubber composition comprising a silicone rubber.

4. The electric generating element according to claim 1, wherein a space is disposed between the intermediate layer and at least one of the first electrode and the second electrode.

5. The electric generating element according to claim 1, wherein the intermediate layer of a stationary state has no surface charge.

6. The electric generating element according to claim 1, wherein a convex structure is formed at a surface of at least one of the first electrode and the second electrode, the surface being in contact with the intermediate layer.

7. The electric generating element according to claim 1, wherein the pressing member is disposed at the surface of the first electrode opposite to the surface of the first electrode facing the intermediate layer.

8. The electric generating element according to claim 1, wherein the intermediate layer has been subjected to a surface modification treatment.

9. The electric generating element according to claim 8, wherein the surface modification treatment is a plasma treatment, a corona discharge treatment, or an electron-beam irradiation treatment.

10. An electric generator, comprising at least one selected from the group consisting of a cover material, an electric wire and an electric circuit; and an electric generating element comprising:
- a pressing member:
- a first electrode;
- an intermediate layer; and
- a second electrode,
- the first electrode, the intermediate layer, and the second electrode being disposed in this order, and
- the intermediate layer being in contact with at least one of the first electrode and the second electrode, wherein:

the pressing member is affixed to:
- a surface of the first electrode opposite to a surface of the first electrode facing the intermediate layer, or
- a surface of a sealing layer opposite to a surface of the sealing layer facing the first electrode, in which the sealing layer, the first electrode, the intermediate layer and the second electrode are disposed in this order; and the intermediate layer microscopically moves in a horizontal direction relative to a surface of the first electrode and a surface of the second electrode, when the intermediate layer is pressed in a vertical direction relative to the surface of the first electrode and the surface of the second electrode in a state that the intermediate layer is not secured with at least one of the first electrode and the second electrode.

11. The electric generating element of claim 1, wherein the pressing member is affixed to the surface of the sealing layer opposite to the surface of the sealing layer facing the first electrode.

12. The electric generating element of claim 1, wherein the pressing member has a convex structure disposed at a surface of the pressing member facing the first electrode or the sealing layer.

* * * * *